United States Patent [19]
Kim

[11] Patent Number: 5,844,314
[45] Date of Patent: Dec. 1, 1998

[54] BUMP COMPRISING PROTUBERANCES AND A METHOD OF FORMING THE SAME

[75] Inventor: Seong Jin Kim, Seoul, Rep. of Korea

[73] Assignee: LG Electronics Inc., Seoul, Rep. of Korea

[21] Appl. No.: 908,951

[22] Filed: Aug. 8, 1997

[30] Foreign Application Priority Data

Dec. 18, 1996 [KR] Rep. of Korea .................. 1996-67285

[51] Int. Cl.$^6$ ........................... H01L 23/48; H01L 23/52; H01L 29/40; H01L 29/04
[52] U.S. Cl. .............................. 257/737; 257/780; 257/57
[58] Field of Search ................................ 257/59, 57, 736, 257/737, 780

[56] References Cited

U.S. PATENT DOCUMENTS 5,042,919  8/1991  Yabu et al. .
5,084,961  2/1992  Yoshikawa .

Primary Examiner—Stephen Meier

[57] ABSTRACT

A bump structure with a recessed portion, as defined by a projection, which collects conductive balls suspended in an ACF when forming a bond between an IC and a liquid crystal panel using the chip-on-glass method. The bump structure improves the electrical contact between the bump and the pad, as well reduce the migration of conductive balls into open areas between aligned bumps during the bonding process.

25 Claims, 14 Drawing Sheets

BUMP COMPRISING PROTUBERANCES AND A METHOD OF FORMING THE SAME

BACKGROUND OF THE INVENTION

Field of the Invention

The present invention relates to a liquid crystal display panel having a driving circuit therein and a method of forming a driving IC (integrated circuit) chip on a glass substrate of a liquid crystal panel during formation of an IC circuit module, and more particularly to a bump structure formed on an electrode of a driving IC chip and a method of forming the same wherein the driving IC chip is formed on the pad of a glass substrate using an anisotropic conductive film (ACF) to improve electrical contact between the bump and the pad, prevent shorts between the bumps, increase manufacturing yield, and increase operational efficiency of the conductive lines in the module.

Among the display devices, a Cathode Ray Tube (CRT) is most commonly used as a display device for a TV or a computer monitor because of its easy color formation and high response time. However, the CRT requires a predetermined distance between an electron gun and a screen, which results in a relatively thick CRT. This increases the weight of the device, decreases its portability, and increases power consumption. In order to overcome the above limitations associated with the use of a CRT, use of a liquid crystal display has been proposed.

There are several distinctions between a CRT and a liquid crystal display. A conventional liquid crystal display displays a darker picture and has a somewhat lower response time when compared to the CRT. Nonetheless, the conventional liquid crystal display does not require an electron gun and each pixel can be selectively operated based on the signal from a common bus line. The liquid crystal display is an ultra-thin display device, suitable for displaying on a wall or for use in all sizes of televisions. Moreover, the conventional liquid crystal display is relatively light-weight and since its power consumption is low compared to the CRT, it can be efficiently operated using merely a battery. Therefore, the liquid crystal display is well suited for use in a notebook computer or in a system requiring a portable display device.

FIG. 1 shows the structure of a typical liquid crystal display. In a typical liquid crystal display, a plurality of scanning lines (gate lines) 104 and a plurality of data lines 106 crossing the gate lines 104 are formed in a matrix on a first substrate 100. At each crossover region, a pixel electrode 108 and a thin film transistor 109 (sometimes hereinafter referred to as "TFT") are formed. Facing the first substrate 100, a second substrate 102 (having a common electrode 110 and color filter 112) is formed. Between the first and second substrates 100 and 102, a liquid crystal 114 is injected to form the liquid crystal panel 130 (See FIG. 3). The liquid crystal along with the pixel electrodes 108 and the common electrode 108 function as pixels for the liquid crystal display panel. On the outer surfaces of both the first and second substrate 100 and 102, polarizing layers 116 are disposed to control selective transmission of light.

FIG. 2 shows a cross-sectional view of a typical thin film transistor used in the liquid crystal panel of FIG. 1. As shown in FIG. 2, the TFT includes a gate electrode 120, a source electrode 121, a drain electrode 122, and a semiconductor channel 123. The gate electrode 120 is formed of a metal such as chromium. The source and drain electrodes 121 and 122 are formed of a metal or a transparent conductive material such as indiumtin oxide (ITO). The gate electrode 120 is connected to a corresponding gate line 104, the source electrode 121 is connected to a corresponding date line 106, and the drain electrode 122 is connected to a corresponding pixel electrode 108.

When a scanning voltage is applied to the gate electrode 120 through the gate line 104, it allows a voltage representing data from the data line 106 to transmit from the source electrode 121 to the drain electrode 122 through the semiconductor channel layer 123. The signal voltage transmitted to the drain electrode 122 causes an electric potential difference between the pixel electrode 108 connected to the drain electrode, and the common electrode 110 formed on the second substrate 102. The electric potential difference causes a change in the orientation of the liquid crystal molecules disposed between the pixel electrode 108 and the common electrode 110. As the orientation of the liquid crystal molecules changes, the light transmittance through the liquid crystal changes. Accordingly, the TFTs of the liquid crystal display panel collectively function as a switching element for selectively driving the pixels of the liquid crystal display.

As shown in FIG. 3, the conventional liquid crystal display includes a liquid crystal display panel 130 for displaying images and driving ICs 131 and 13 for generating an image signal. The typical liquid crystal display includes a first pad 133 connected to the gate lines 104 and a second pad 134 connected to the data lines 106. The first pad 133 is connected to a first IC 137 which generates a scanning signal, whereas the second pad 134 is connected to a second IC 138, which generates a data signal. The scanning signal generated from the first IC 137 is transmitted to the gate lines 104 through the first pad 133. The data signal generated from the second IC 138 is transmitted to the data lines 106 through the second pad 134. There are many methods for connecting the first pad 133, or the second pad 134, with the first IC 137 or the second IC 138. However, in order to connect the IC with the pad, it is necessary to form a bump at an electrode of the IC prior to the connection between them.

FIGS. 4A–4C are cross-sectional views for illustrating a typical method of forming a bump for a liquid crystal display. As shown in FIG. 4A, a protective layer (passivation layer) 145 is formed over a surface of the IC 140, except in an area where the electrode 141 is formed. On the protective layer 145 and over the electrode 141 of the IC, a metal 142 is deposited. A photoresist 143 is then applied over the metal 142, which defines a region in which a bump is to be formed. The metal 142 serves to ensure a uniform deposition of gold in subsequently forming the bump by electrodeposition.

As shown in FIG. 4B, a gold (Au) is deposited by electrodeposition on the metal 142 exposed through the photoresist 140 formed on the IC 140. Since the photoresist 133 is made of an insulating material, gold is not deposited on the photoresist 140 during electrodeposition. Therefore, gold is deposited on a portion of the metal 142 corresponding to the electrode 141 of the IC so as to form a bump 144. Here, it is preferred that the height of the bump 144 is greater than the height of the photoresist 143. In which case, the bump will slightly overlap the photoresist 143. The reason for forming the bump 144 to slightly overlap the photoresist 143 is to enhance contact with other electrodes. As described above, the bump is preferably made of gold. However, other materials having similar properties may also be used such as copper Cu or nickel Ni.

As shown in FIG. 4C, once the bump 144 is formed, the photoresist 143 is completely removed by chemical stripping. Those portions of the metal 142 outside the bump 144 are then removed, so that only the bump 144 (made of gold supported on a portion of the metal 142) remains on the electrode 141 of the IC.

Generally, a TAB (tape automated bonding) process is used to connect the bump 144 on the IC 140 with the pads. The TAB process involves an ILB (inner lead bonding) step, and an OLB (outer lead bonding) step. The ILB step includes attaching a carrier film lead to the electrode of the IC through the bump. After the ILB step is completed, the OLB step attaches the lead of the TAB package connected to the pad of the liquid crystal display panel.

FIGS. 6A, 6B and 6C are cross-sectional views for explaining a conventional TAB process.

As shown in FIG. 6A, a bump 144 is formed on the electrode 141 of the IC to be connected with a pad of the liquid crystal panel. The bump is formed by using the method previously described referring to FIGS. 4A–4C.

As shown in FIG. 6B, an edge of a polyimide film including a plurality of metal lines is correspondingly aligned above each of the bumps. The metal lines 151 are attached to the polyimide film 150 by an adhesive (not shown). The metal lines 151, as attached to the polyimide film 150, function to transmit a signal generated from the IC.

As shown in FIG. 6C, the polyimide film 150 is attached to the bump by a bonding process to cause an electrical short. During this process, in order to attach the polyimide film 150 with the bump 144, a heat process method is utilized to make an eutectic alloy of the portion between the bump and the lead for bonding the film 150 to the electrode of the IC. Further, to achieve protection from external impact and to resist moisture, a protective resin 155 is formed to encapsulate the bonding areas.

FIG. 5 shows the connection between the LCD panel and a bumps. Once one end of the polyimide film 150 is bonded to a corresponding bump 144, the other end of the polyimide film 150 is bonded to the pad of liquid crystal panel 170 using an anisotropic conductive film (ACF) (not shown). During this process, it is necessary to align the metal line so that the metal line shorten with the electrode of the IC is in contact with the pad through conductive balls in the ACF. This TAB process allows the IC to be disposed externally to the liquid crystal panel and a short between the electrode of IC and the electrode of the liquid crystal panel through the polyimide film with the metal line bonded thereto.

In contrast to the TAB process, another method for attaching IC's to an LCD panel is the COG (chip on glass) process which adheres an IC directly on a glass substrate of a liquid crystal panel. The COG method does not utilize the polyimide film used in the TAB process, but attaches the bumps to the pads using ACF to bond the IC on the glass substrate. The COG method is both simpler and less expensive than the TAB method since the use of the polyimide film is eliminated. It also decreases the space occupied the liquid crystal display making the finished device more suitable for smaller devices.

FIGS. 7A and 7B are cross-sectional views for explaining a method of bonding an IC using the COG method.

As shown in FIG. 7A, an ACF is placed on the glass substrate 180 and pads 181 of the liquid crystal display panel. The bumps 144 supported by the IC 140 are aligned with the pads 181 of the glass substrate 180. The ACF 153 occupies the area between the IC 140 and the substrate 180. The ACF 153 contains a plurality of conductive balls 154 (also referred to as conductive particles) which are disbursed throughout the film 153. The bump 144 is formed as shown in FIG. 4.

With reference to FIG. 7B, the IC is bonded to the glass substrate using heat process. Conductive balls (or conductive particles) 154 dispersed in the ACF 153 are suppressed between each of the bumps 144 and the pads 181 such that the conductive particles collectively establish a short between the pads 181 and the electrodes of the IC. As a final step, heat is applied to the IC for hardening the softened ACF to form a securely bonded IC on the pad of the glass substrate.

The TAB method is useful for forming a reliable connection between the ICs and the liquid crystal display panel. However, the TAB method has the disadvantage of making the process of assembling the LCD more cumbersome by requiring a first step for applying the polyimide film and a second step for applying the ACF resin. Therefore, to utilize the TAB method, the number of steps required for manufacturing a liquid crystal display is increased. Further, the polyimide film adds significantly to the cost of assembling the LCD. Moreover, because the polyimide film is required to connect the IC, the size of the liquid crystal display is considerably increased.

The COG method overcomes many of the problems associated with the TAB method by directly attaching the IC to the pad of the glass substrate. However, the COG bonding method has the following problems. As illustrate in the portion of FIG. 7B within the dotted line circle "A", the resin begins to flow when heat is applied to the IC for bonding the ACF above a glass transition temperature Tg. This flow phenomenon is depicted by the arrow 183. As the ACF flows, the conductive balls (conductive particles) suspended in the ACF also flow to migrate to the open spaces between the bumps. The migration of the conductive balls causes a problem near the peripheral edge portions of the bump head so that the electrical contact between the bump and the pad is poor due to less number of conductive balls remaining thereof. Furthermore, when the migrated conductive balls concentrate in the open spaces between adjacent bumps, an electrical short between the bumps occurs. Consequently, the contact resistance can be increased and leakage of signal can occur.

SUMMARY OF THE INVENTION

Accordingly, it is an object of the present invention to provide a bump with a projection for bonding an IC on a pad of a liquid crystal display panel and a method of forming the same which eliminates the above problems encountered in the conventional bump devices and the methods.

Another object of the present invention is to provide a bump having a pre-determined configuration for entrapping conductive particles dispersed in an ACF for effectively bonding the electrode of an IC to a pad of a liquid crystal display panel.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawings which are given by way of illustration only, and, thus, are not limitative of the present invention, and wherein.

DETAILED DESCRIPTION OF THE PREFERRED EMBODIMENTS

The present invention is directed to a bump having a projection for entrapping conductive balls underneath when bonding a pad to an IC, which is used as part of an improved COG method for connecting a liquid crystal panel to an IC.

FIRST EXAMPLE

Figure 8A:
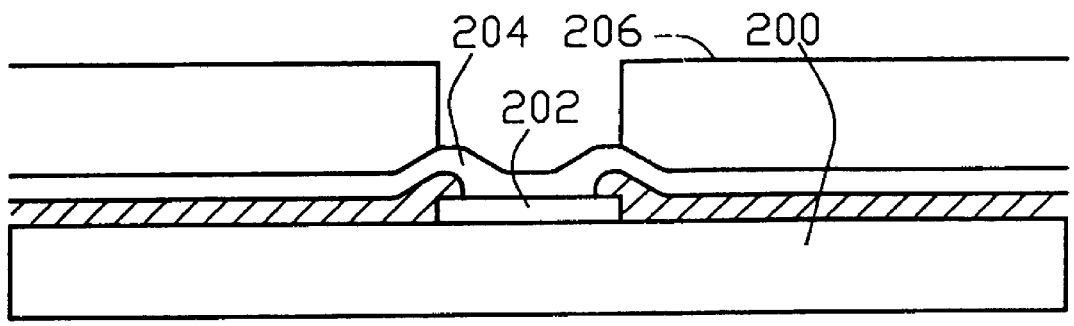
FIGS. 8A–8F show cross-sectional views for illustrating a method of forming a bump according to the embodiments of the present invention.

As shown in FIG. 8A, a metal layer 204 is formed over a passivation layer 245 and an electrode 202 of an IC. The metal layer 204 is formed using an alloy of Ti and W. Both the passivation layer 245 and the electrode 202 are supported on the semiconductor IC 200. A photoresist 206 is disposed over the metal layer 204 with the exception of an area for forming a bump thereon immediately above the electrode 202.

Figure 8B:
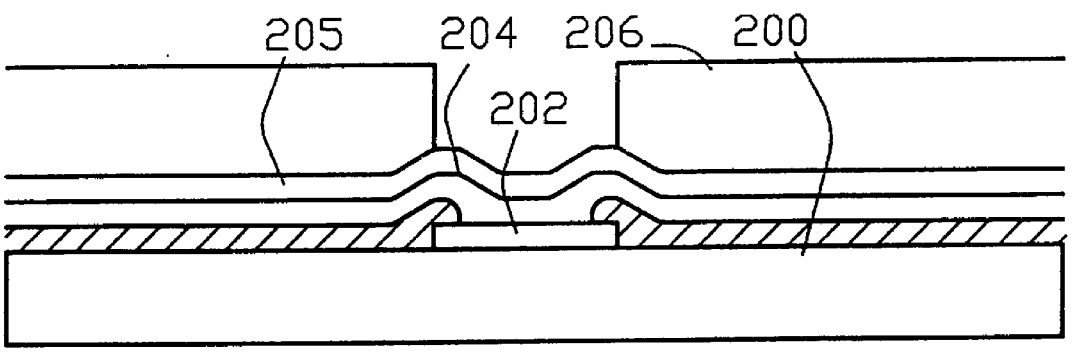

In an alternative embodiment, a thin layer of gold (Au) 205 is formed on the metal layer 204 as shown in FIG. 8B. The thin layer of gold 205 enhances the electrodeposition of gold (Au) in later forming the bump 208.

Figure 8C:
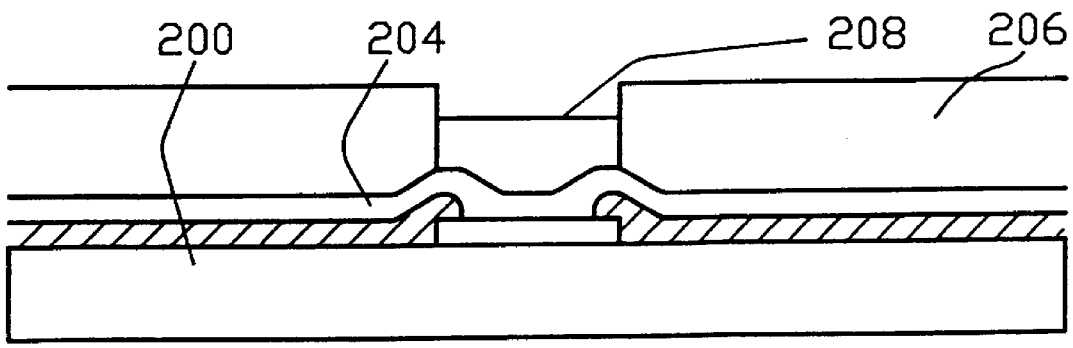

FIG. 8C shows the initial step of forming the bump body 208 by a first electrodeposition of gold on the exposed portion of the metal layer 204 through the photoresist 206. Since the photoresist 206 is made of an insulating material, the gold is deposited on the metal layer 204 without deposits on the surface of the photoresist. Thus, gold is deposited only on the exposed portion of the metal layer 204 where the photoresist is not present.

The height and width of the bump body 208 are determined for effecting a secure bond between the bump 214 and the corresponding pad. The width of the bump body 208 is approximately equal to the width of the gate electrode 202 of the IC in the preferred embodiment. The height (or thickness) of the bump body 208 is less than the thickness of the photoresist 206. The bottom edges of both the photoresist 206 and the bump body 208 are aligned substantially along the same plane as defined by the upper surface of the metal 204. As a result, the top surface of the bump body 208 is offset from the upper surface of the photoresist 206 to form a recessed portion reflecting the thickness difference between the bump body 208 and the photoresist 206. The depth of the recessed portion is determined by considering the average diameter of the conductive balls being used in the ACF which is about 5 to 7 micrometers. More specifically, the depth of the recess is greater than one-half, and less than three times, the average diameter of the conductive balls dispersed in the ACF. The depth of the recess is an important aspect of the invention for ensuring that a sufficient number of conductive balls are collected in the critical area between each of the bumps and the pads during the process of bonding the IC.

Figure 8D:
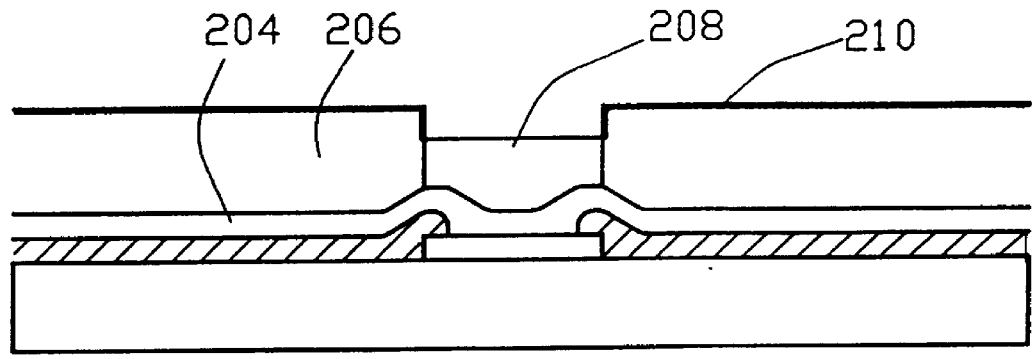
Figure 8E:
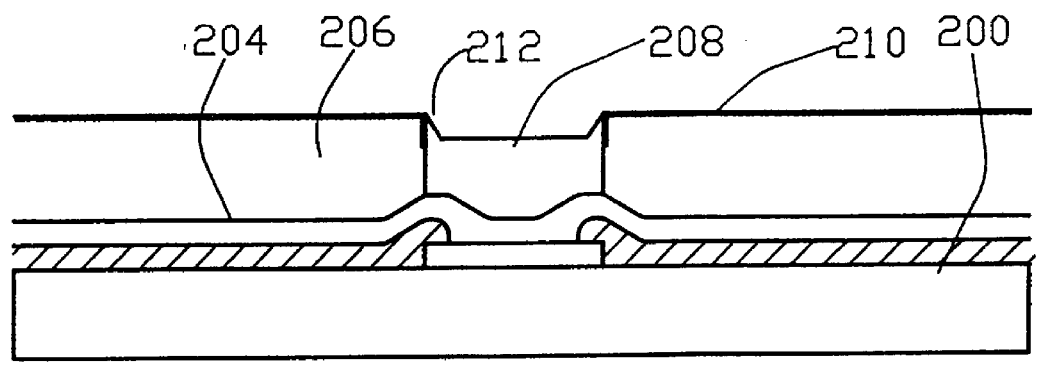

As shown in FIG. 8D, the upper surface 210 of the photoresist 206 is carbonized by causing a reaction with an oxygen plasma. As a result of the precess, the carbonized photoresist surface 210 becomes slightly conductive. In carbonizing the photoresist 206, the pressure of the oxygen plasma is about 150 m torr and the process lasts for 10 minutes to burn the photoresist 206 along its upper surface 210 up to a depth of 2.5 micrometers.

After the surface of the photoresist 206 is carbonized to make it slightly conductive, gold is formed on the bump body 208 by a second electrodeposition to create a continuous projection 212 about the peripheral upper edge of the bump body 208. The gold used here is the same material as the gold used to form the bump body 208. However, the second electrodeposition forms a thin layer of gold within the recess and along the top peripheral edge of the bump body 208 where the bump body 208 contacts the carbonized photoresist 206. The gold to be deposited by the second electrodeposition functions as an extension of the bump body 208.

The gold is deposited by the second electrodeposition only on the portions of the carbonized photoresist surface within the recess. This allows for forming the projection 212 in a continuous closed boundary about the outer edge portion of the bump body 208.

Figure 8F:
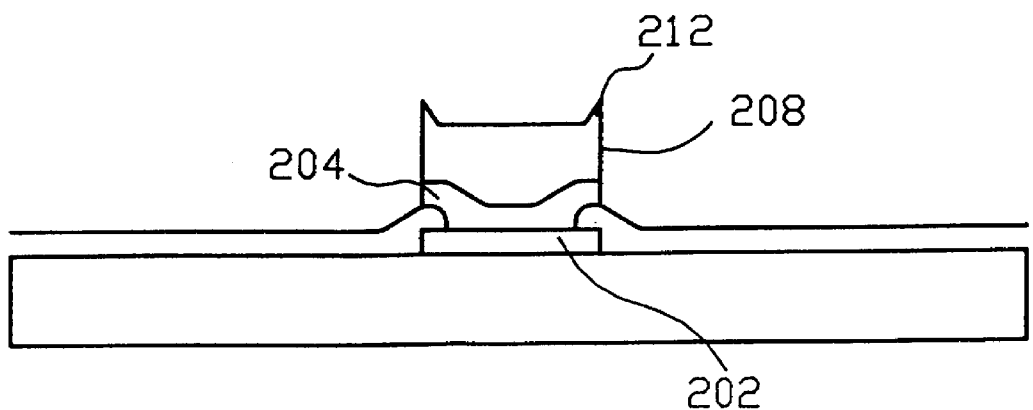

As shown in FIG. 8F, the photoresist 210 is completely removed by chemical stripping. At the same time, the metal layer 204 formed under the photoresist 206 is also removed, leaving the bump 214 having projection 212 as supported on a section of the metal layer 204 and the electrode 202.

Figure 9A:
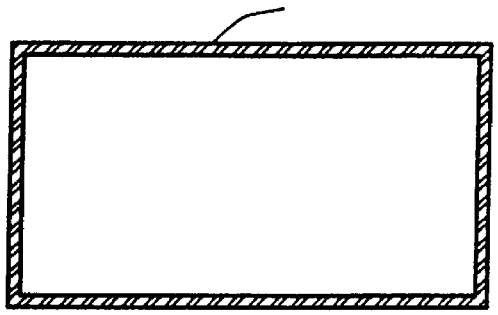
FIGS. 9A and 9B show a top plan view and a side view of a bump, respectively, formed according to the embodiments of the present invention.
Figure 9B:
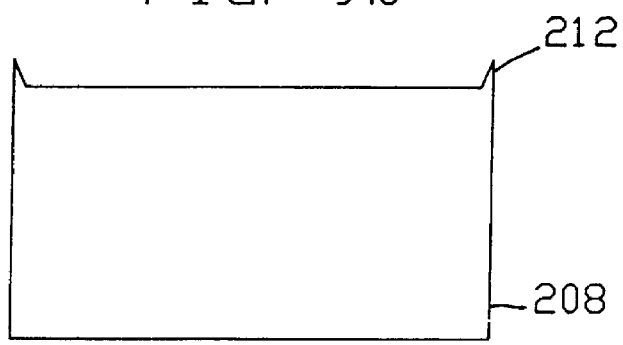

FIGS. 9A and 9B show a top plan view and a side view of the bump 214, respectively, formed according to the above described method. The projection 212 is formed on the upper surface of the bump body 208 opposite from the IC and along the outer peripheral edge of the bump 208. The projection 212 forms a closed boundary that defines the recess. The projection 212 has a height which is greater than one-half of the diameter of the conductive balls and less than three times the diameter of the conductive balls. This is the same height as described previously for the depth of the recess. In addition, the width of the projection is less than the diameter of a conductive ball. If the projection 212 is too thick then it is not sufficiently flexible to bend in forming a secure seal for preventing migration of the conductive balls from underneath the bump and into the open areas between the bumps. Similarly, if the projection 212 is formed to thin, then the projection 212 may break as the bump presses against the pad. This is especially true, since the projection 212 is formed of gold, or other pliable low resistance metal.

EXAMPLE 2

In addition to the processing steps described above in Example 1, the following steps are performed to increase the number of conductive balls entrapped within the recess of the bump 214.

Figure 10A:
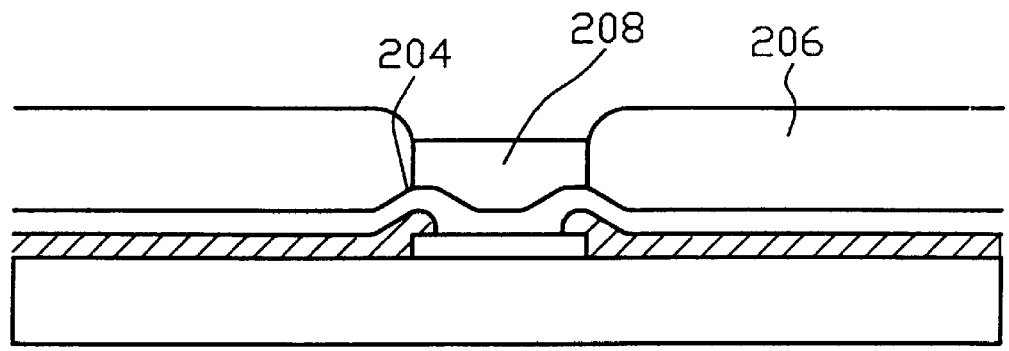
FIGS. 10A–10D show cross-sectional views for illustrating another method of forming a bump according to the embodiments of the present invention.

As shown in FIG. 10A, the IC including the bump by the first electrodeposition is placed in an infrared ray oven and subjected to a hard baking process. In the hard baking process, the temperature of the oven is set at approximately 60° C., and the IC having the bump is baked for about 30 minutes. As a result, the photoresist formed on the IC shrinks as shown in FIG. 10A to form rounded areas between the upper surface of the bump body 208 and the upper surface of the photoresist 206. If the hard baking process is performed longer than a predetermined period, the photoresist will shrink excessively so that the projection on the bump curves at an extreme angle so that an electric short may occur between the bumps. Therefore, it is necessary to control the temperature and operation time of hard baking, depending on the material used to form the photoresist.

Figure 10B:
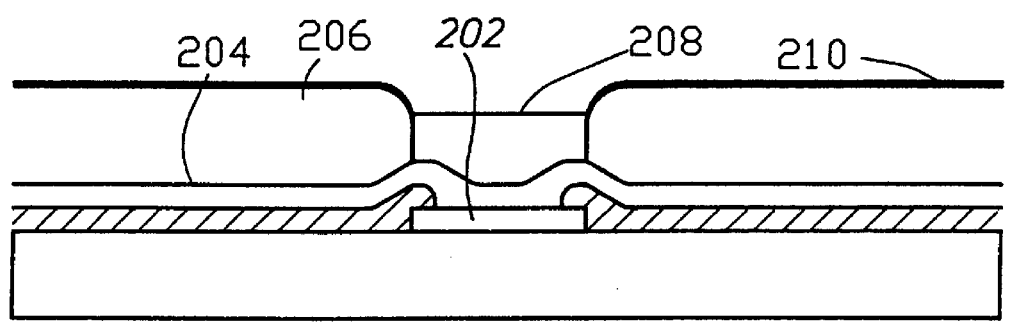

As shown in FIG. 10B, the warped or shriveled surface of the photoresist 206 is carbonized by reacting with an oxygen plasma in a manner consistent with the previously explained embodiment. This process causes the surface 210 of the photoresist 206 to manifest a slightly conductive property.

Figure 10C:
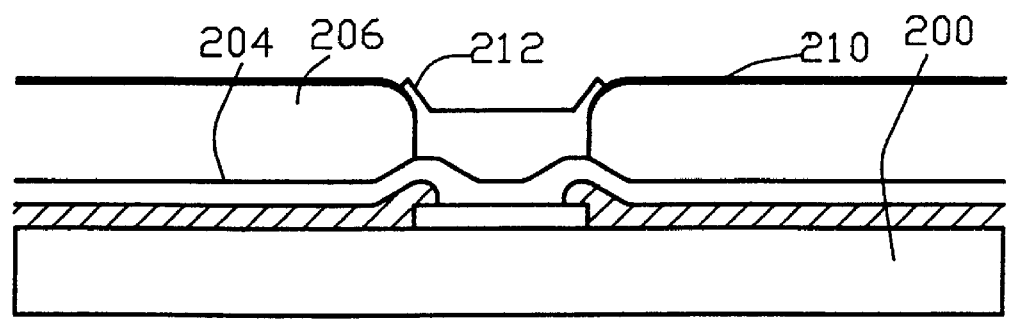

Over the surface 210 of the now-conductive photoresist 206, a second electrodeposition process is performed to create the projection 212 that extends outward from, and in a defined angular relationship with respect to, the upper surface of the bump body 208. The second electrodeposition forms a layer of gold which is thinner than the one formed by the first electrodeposition. The second gold layer is thinly deposited on the photoresist within the recess where the upper surface of the bump body 208 contacts the photoresist 206. However, since the edge of the photoresist is rounder than the edge of the photoresist of the first example, the projection 212 curves slightly outwardly, as shown in FIG. 10C. In one preferred embodiment, the projection 212 creates an outward angle in the range of from between 80° to 85° (or most preferably 82° or 83°) with respect to a plane defined by the upper surface of the bump body 208.

Figure 10D:
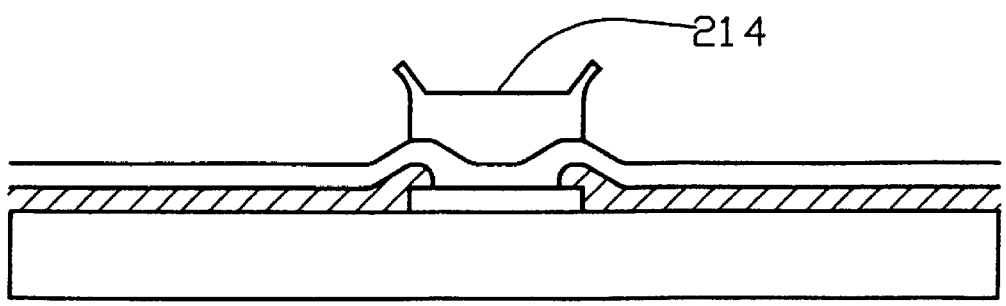

As shown in FIG. 10D, the photoresist 210 and the metal layer 204 are then removed. With the exception of the angled projection 212, the width and height of the bump 214 and the width and height of the projection 212 are the same as described in Example 1.

Figure 7A:
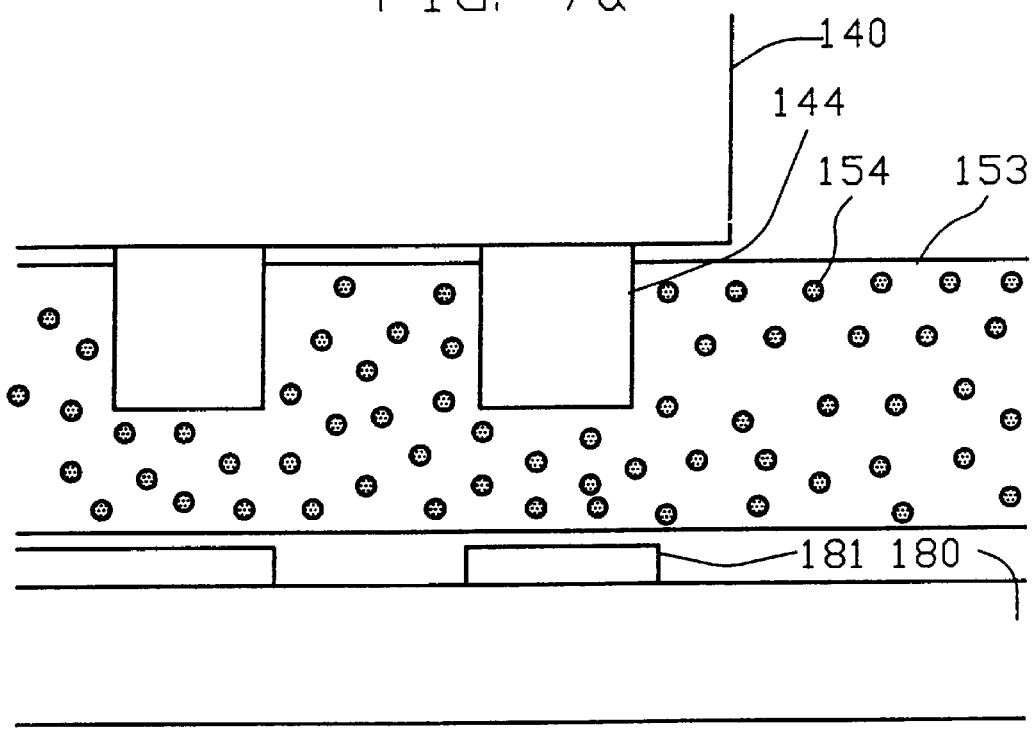
FIGS. 7A–7B show cross-sectional views for illustrating a COG method for bonding an IC to a pad.
Figure 11A:
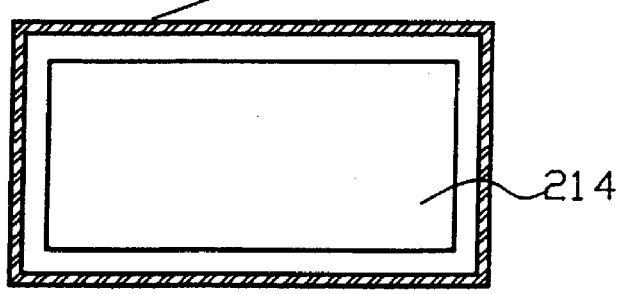
FIGS. 11A and 11B show a top plan view and a side view of another bump, respectively, formed according to the embodiments of the present invention.
Figure 11B:
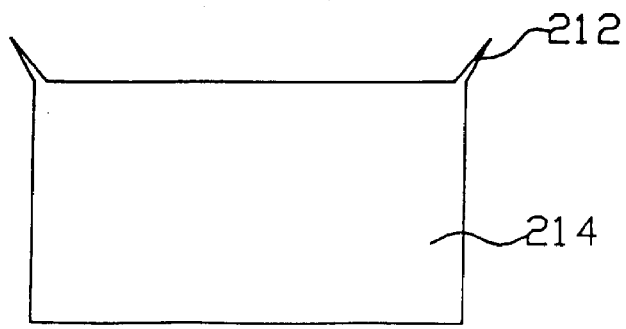

FIGS. 11A and 11B show a top plan view and a side view of the bump 214, respectively, formed according to the method illustrated in FIGS. 10A–10D. As shown in FIG. 11A, the projection 212 is formed on a surface opposite from the IC around the outer peripheral edge of the bump. The primary difference between the bump of Example 1 and the bump of Example 2 is the angle of the projection 212 that defines the recess. The angled projection 212 is effective in reducing the migration of conductive balls into the open areas between the bumps as illustrated in FIG. 7A with reference to the conventional art.

EXAMPLE 3

Figure 12A:
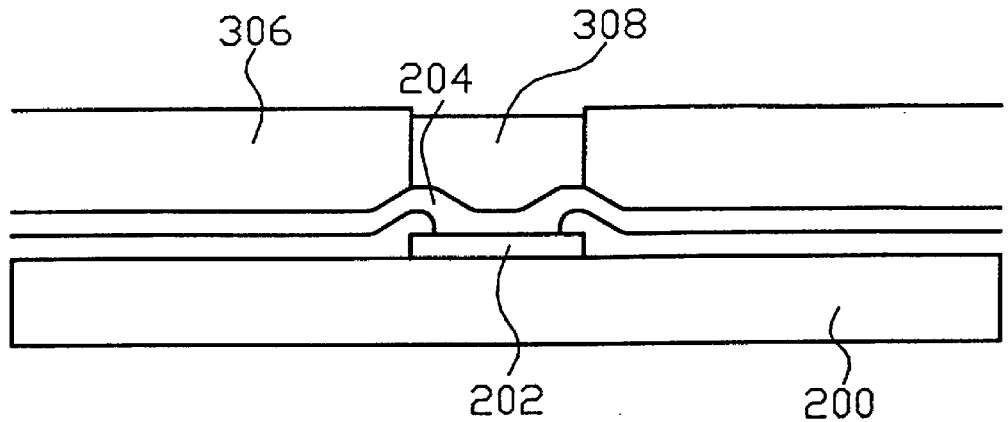
FIGS. 12A–12C show cross-sectional views for illustrating a method of forming a bump using a masking process according to the embodiments of the present invention.
Figure 12B:
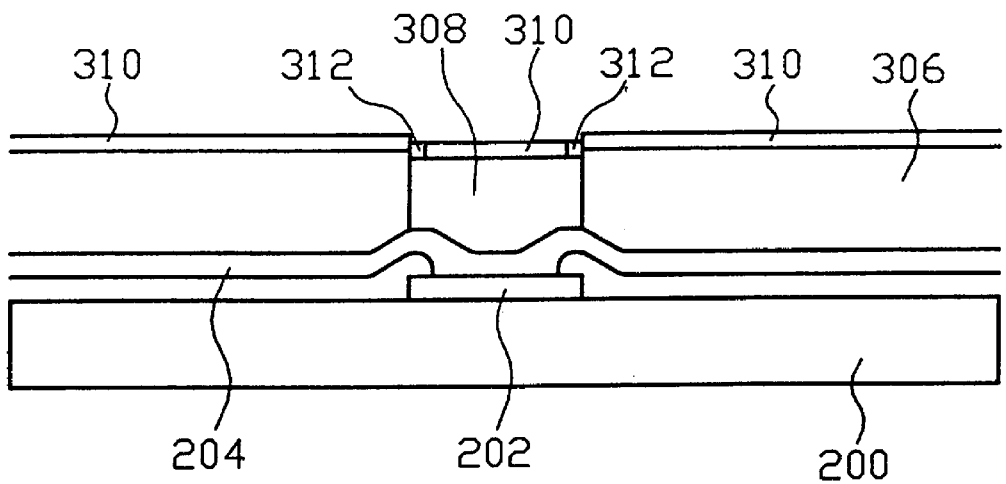
Figure 12C:
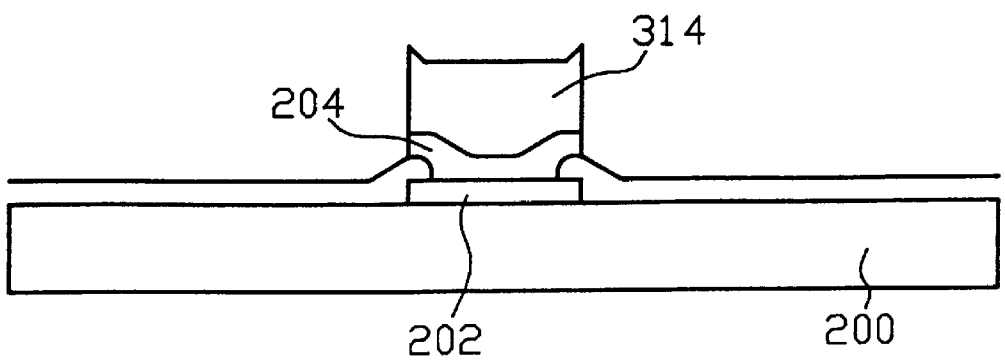

The process involved in Example 3 is similar to the process described in Example 1. FIGS. 12A–12C are used to explain Example 3.

Figure 1:
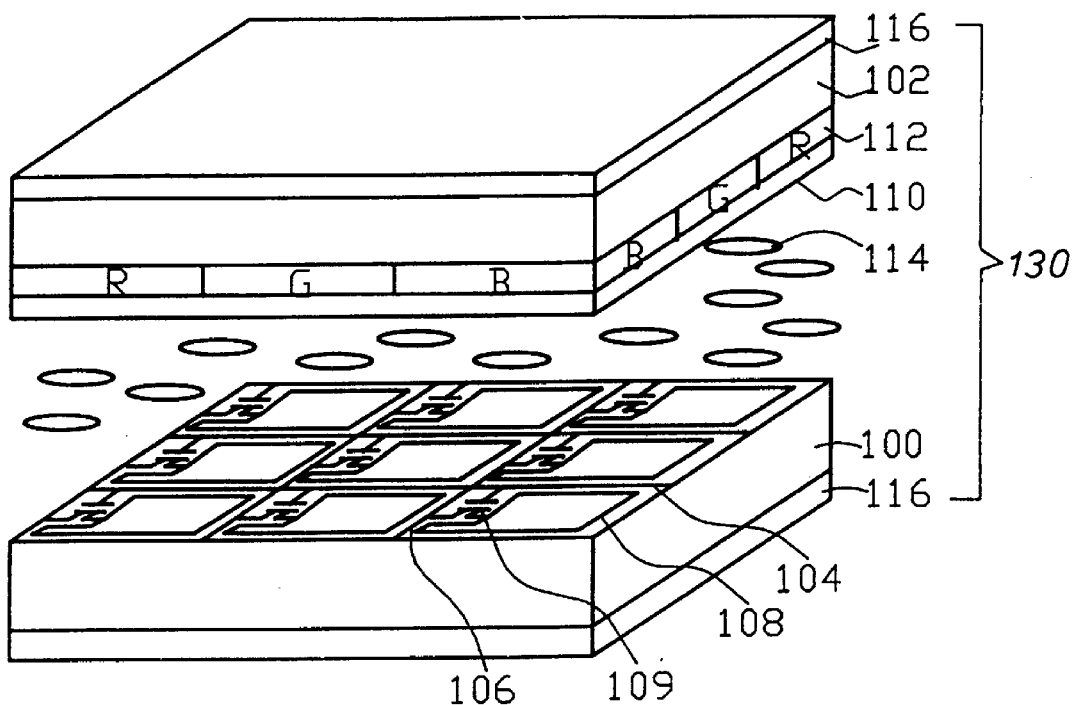
FIG. 1 shows a liquid crystal display panel of a typical liquid crystal display.
Figure 2:
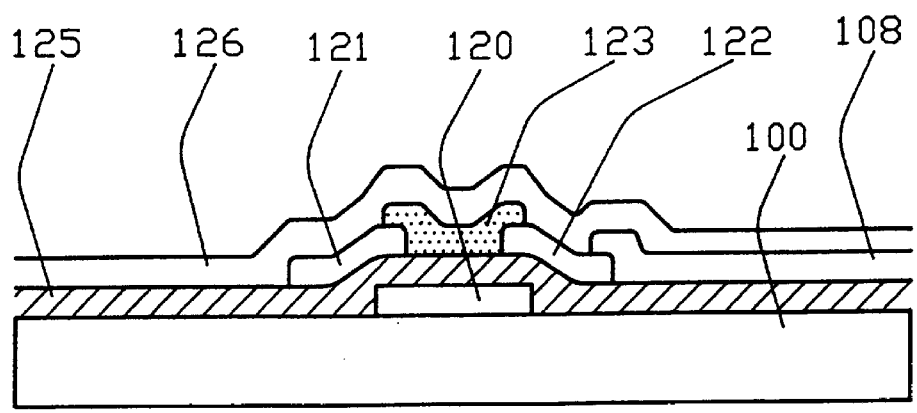
FIG. 2 shows a cross-sectional view of a typical thin film transistor used in the liquid crystal display of FIG. 1.
Figure 3:
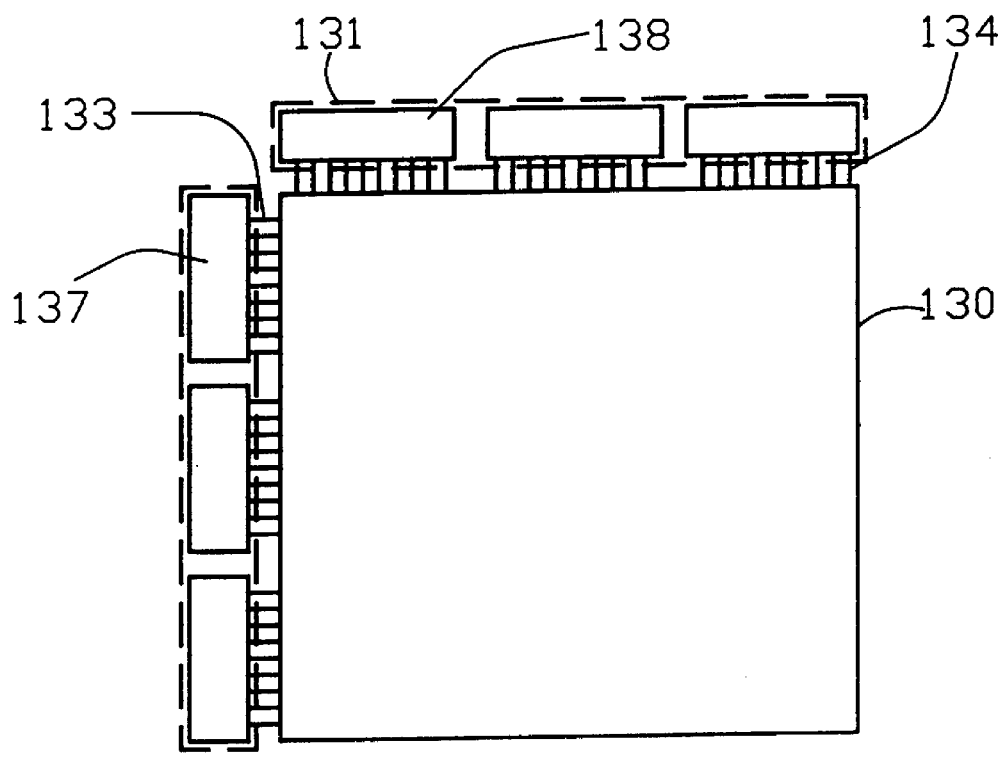
FIG. 3 shows a general view of a liquid crystal display panel and a driver IC bonded to the panel.
Figure 5:
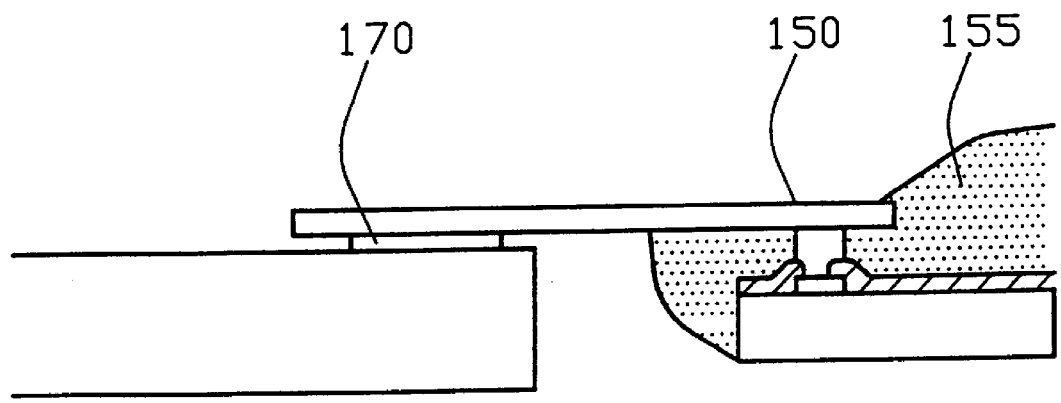
FIG. 5 shows a cross-sectional view for illustrating a TAB method for bonding a carrier film with a bump of an IC.
Figure 4A:
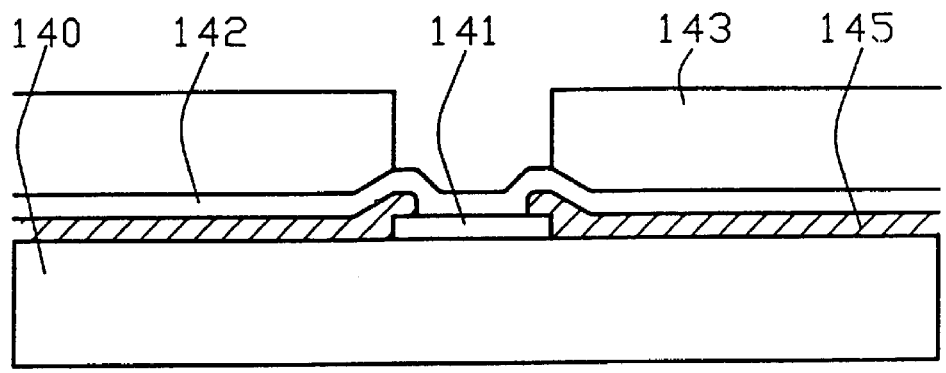
FIGS. 4A–4C show cross-sectional views for illustrating a method of forming a bump on an IC.
Figure 4B:
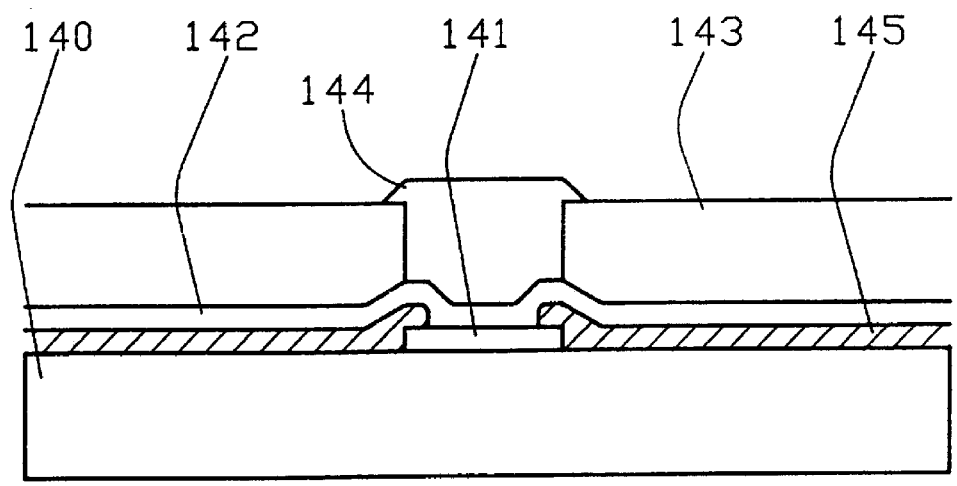
Figure 4C:
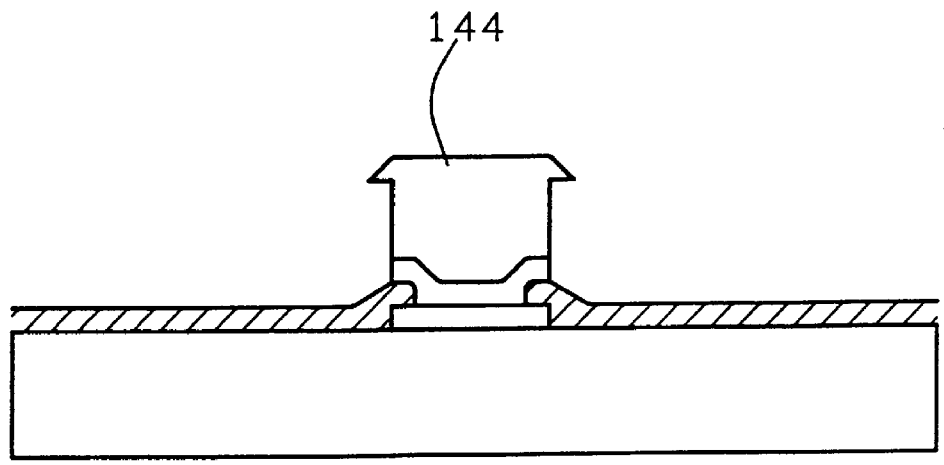
Figure 6A:
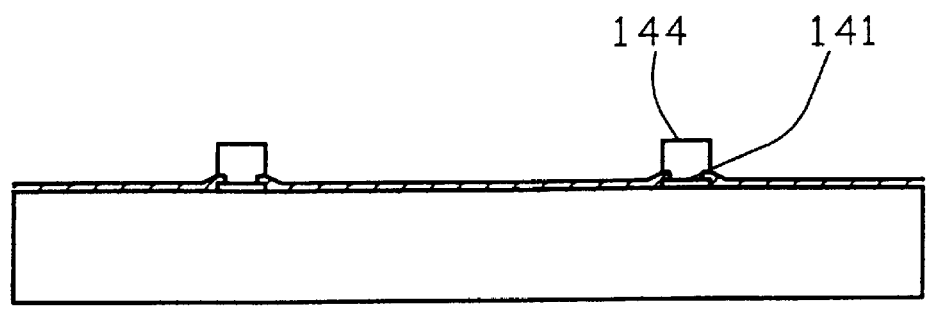
FIGS. 6A–6C show cross-sectional views for illustrating a TAB method for bonding an IC to a pad.
Figure 6B:
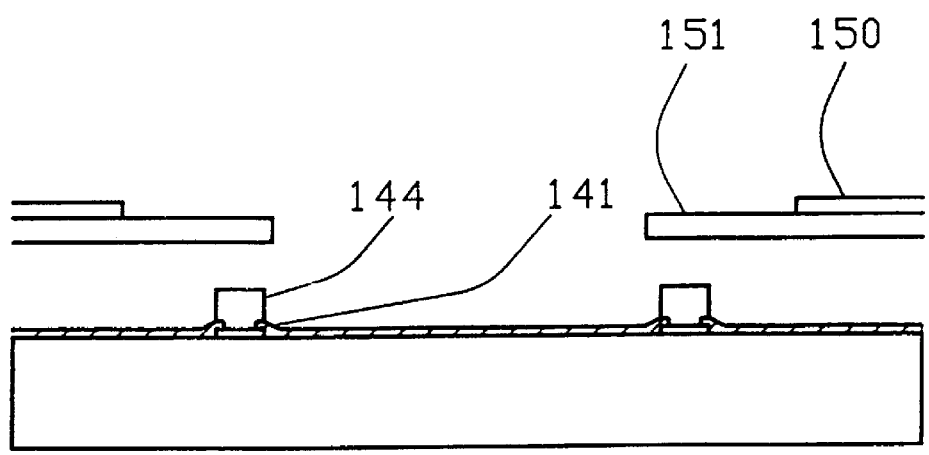
Figure 6C:
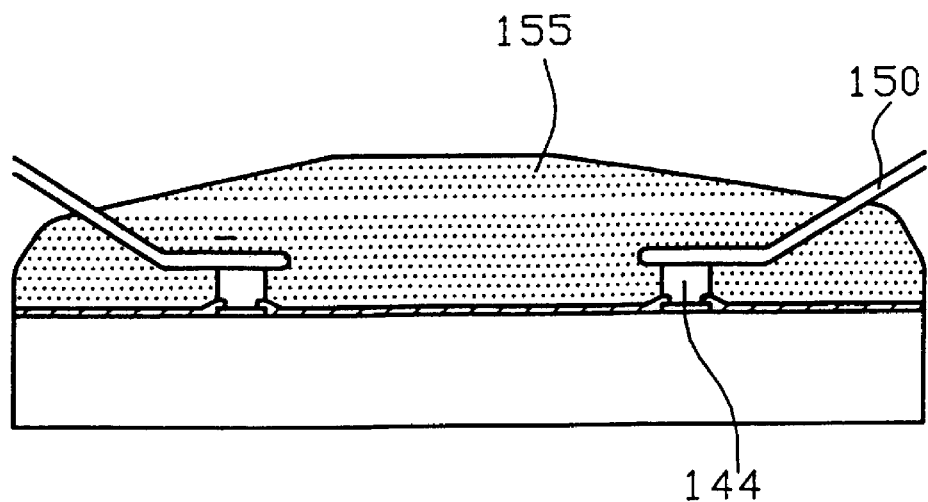

As shown in FIG. 2A, a metal layer 204 is formed on the surface of an IC 200. Using a patterning process, a first photoresist 306 is formed to define an area for creating the bump body 308. This region is above the electrode 202 of the IC. An alloy of Ti and W is generally used to form the metal layer 204. A layer of gold is formed on the exposed portion of the metal layer 204 by a first electrodeposition process to form the bump body 308. As described above, since the first photoresist 306 is made of an insulating material, the gold deposits only on the surface of the metal layer within the exposed area and not on the upper surface of the photoresist 306. The height of the bump body 308 should be made consistent with the method described in Examples 1 and 2.

As shown in FIG. 12B, in the middle portion of the bump and on the first photoresist 306, a second photoresist 310 is coated. On the portions of the bump body 308 which are not covered by the second photoresist 310, the projection 312 is formed by performing a second electrodeposition using gold. The gold used in the second electrodeposition is the same as the gold used in the first electrodeposition. The second electrodeposition forms a layer of gold thinner than the layer of gold formed by the first electrodeposition. The projection 312 is made with dimensions consistent with those of Examples 1 and 2.

As shown in FIG. 12C, by eliminating the first and second photoresists 306 and 310, respectively, and the metal layer 204 formed underneath by chemical stripping and etching, a bump 314 is formed on the electrode of the IC.

Advantages of Present Invention

The bump according to the present invention provides a better electrical contact between the pad of an liquid crystal display panel and the IC using the COG method. The advantages of the disclosed bump are shown in FIGS. 13A–13C and FIG. 14.

Figure 13A:
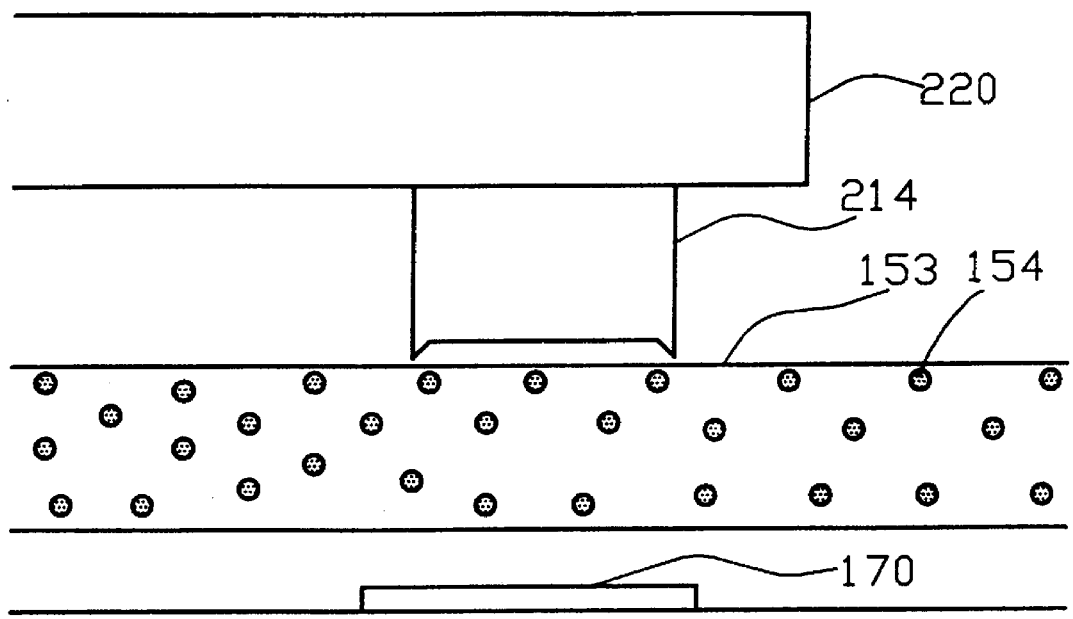
FIGS. 13A–13C are cross-sectional views for illustrating a method of forming a bump using a COG technique in accordance with the embodiments of the present invention.

As shown in FIG. 13A, ACF 153 has a plurality of conductive balls 154 dispersed therein. The ACF 154 is used for bonding the bump 214 of the IC 220 with the pad 170 of the liquid crystal panel. The bump 214 is positioned in line with the pad 170 with the ACF 153 positioned therebetween.

Figure 7B:
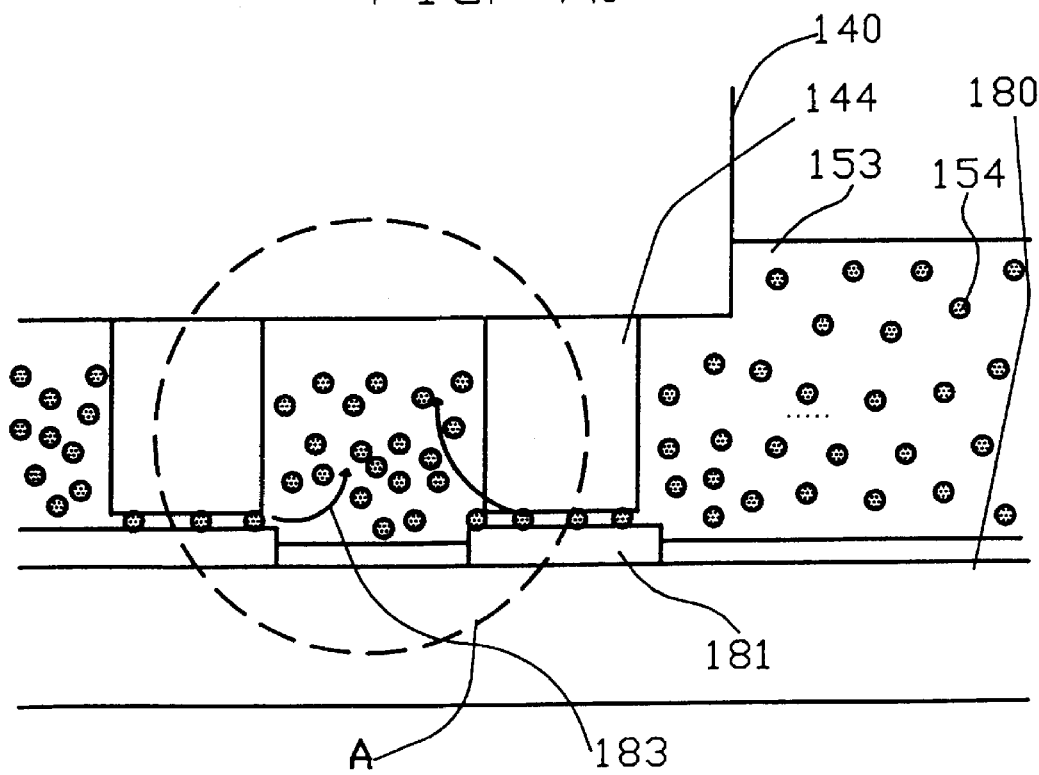
Figure 13B:
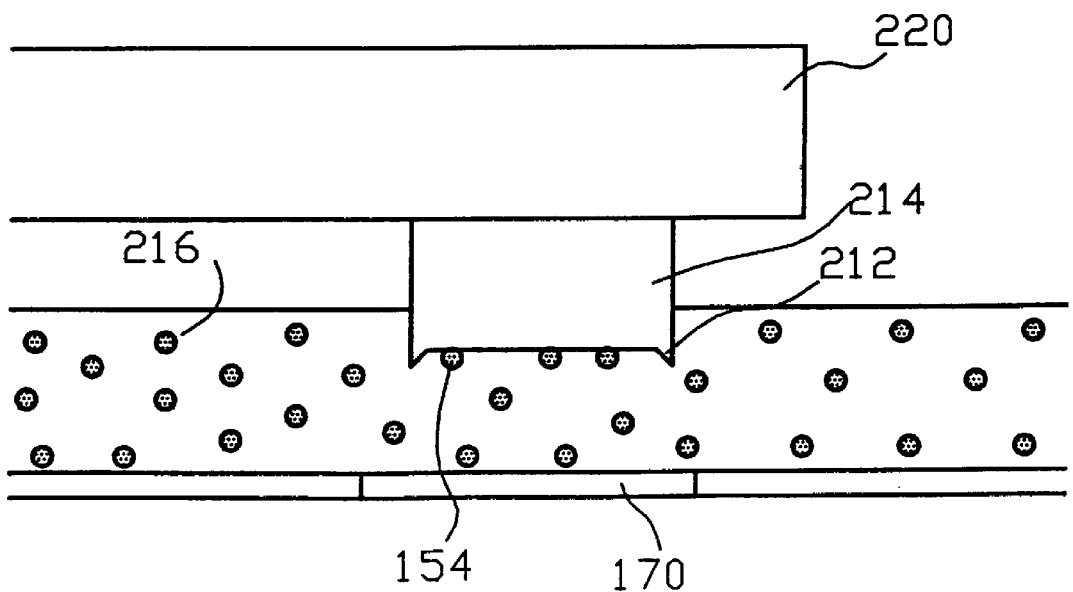

In FIG. 13B, heat and pressure are simultaneously applied to effect bonding the bump to the pad of the IC and the bump 212 is moved toward the pad 170. At this time, the ACF 153 manifests a flowing phenomenon in that the conductive balls 154 dispersed in the ACF 154 begin to flow into the open spaces 216 between the bumps, similar to the conventional COG method shown in FIG. 7B. However, the projection 212, formed on the outer peripheral edge of the bump 214, begins to collect the conductive balls underneath the bump 214 for preventing the conductive balls 154 from flowing away from the bump 214.

Figure 13C:
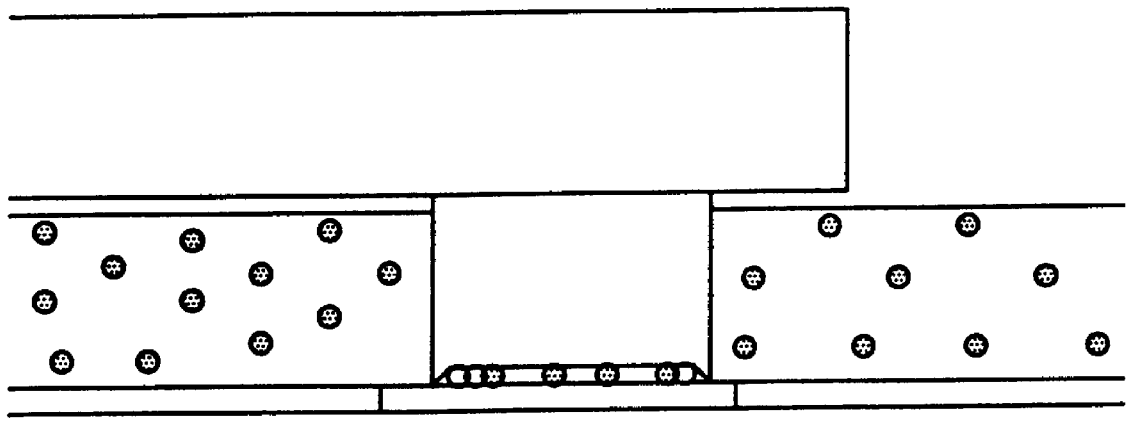

As shown in FIG. 13C, as the heat and pressure are continuously applied to the IC, the conductive balls begin to concentrate at the outer edge of the bump. The increase of conductive balls underneath the bump when the surface area within the recess of the bump is 40×80 micrometers, is more than ten times compared with the number of conductive balls present underneath a conventional bump with a conductive ball distribution of 20,000 ea/millimeter square in ACF. This indicates that at least 20% increase occurs in the number of conductive balls underneath the bump by the bonding process according to the present invention.

Figure 14:
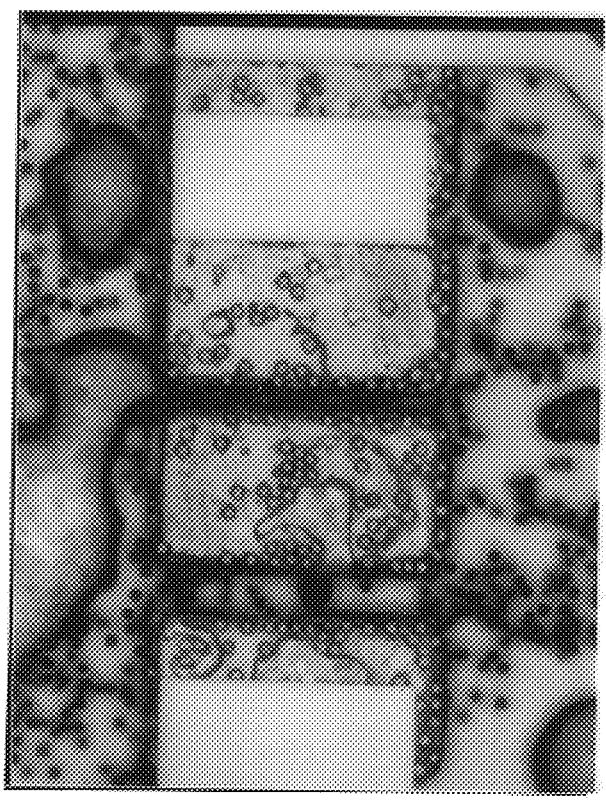
FIG. 14 depicts an increased number of conductive balls formed underneath the bump when the bump formed according to the present invention is used.

FIG. 14 is a picture showing the distribution of conductive balls formed underneath the bottom surface of the bump in the recess and around the outer edge of the projection. In the picture, the rectangular shape defined by the dark portion indicates the bump and smaller shapes indicate conductive balls. The following table (Table 1) shows the contact resistance between the pad and the bump with the projection, and the contact resistance between the pad and the bump without the projection. In Table 1, the contact resistance between the pad and the bump having the projection is substantially less than the contact resistance between the pad and the bump without the projection.

TABLE 1

Contact Resistance Comparison Between the Bump Without Projection and the Bump With Projection

| bump form | pin 7 | pin 8 | pin 9 | pin 37 | pin 38 | pin 39 | maximum value | minimum value | average | error |
|---|---|---|---|---|---|---|---|---|---|---|
| without projection (Ω) | 27.1 | 22.3 | 21.0 | 15.0 | 19.0 | 23.0 | 27.1 | 15.0 | 21.2 | 4.1 |
| with projection (Ω) | 13.1 | 9.6 | 12.5 | 9.3 | 9.0 | 6.8 | 13.1 | 6.8 | 10.1 | 2.4 |
| bottom surface size of bump | | | 40 × 80 μm | | | | | | | |

Using the bump according to the present invention, a greater number of conductive balls can be collected to the bump for enhancing the electrical contact between the pad and the IC electrode. Furthermore, since it decreases the number of conductive balls present in the empty space between the bumps, any shorts between the bumps can be prevented. That is, since the contact resistance between the IC electrode and the pad decreases and the insulating effect between the bumps is enhanced (since a lesser number of conductive balls migrate to the empty space), a signal from the IC is securely transmitted to the liquid crystal display panel.

Figure 15A:
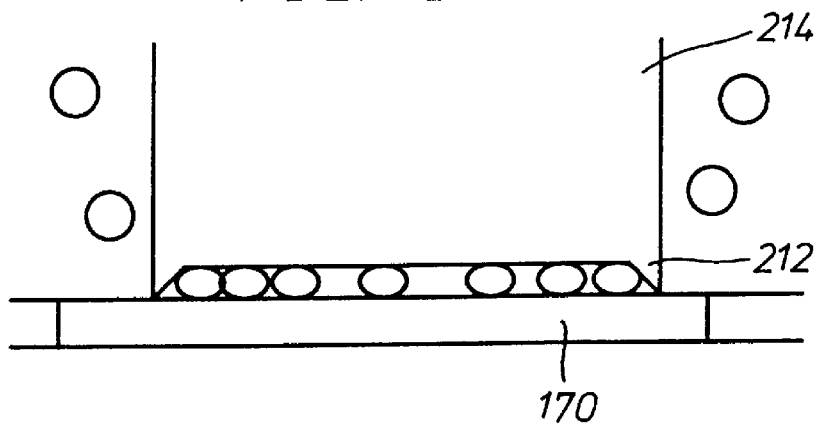
FIGS. 15A–15C show cross-sectional views for illustrating recessed portions of the bump having different heights based on the average diameter of the conductive balls.
Figure 15B:
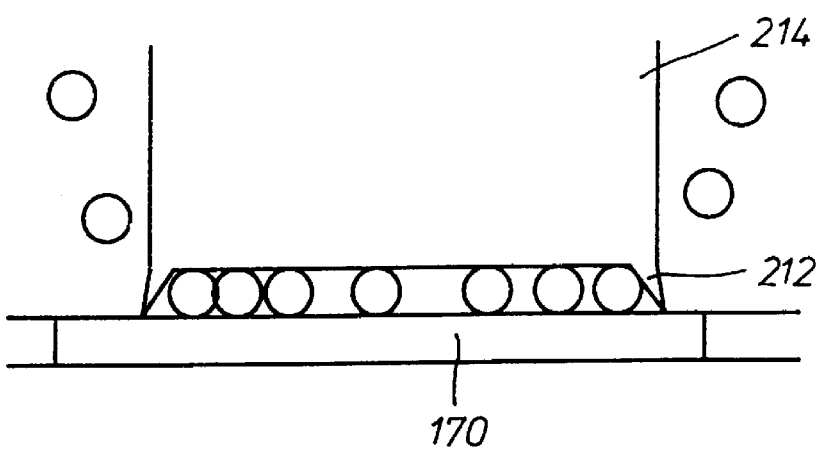
Figure 15C:
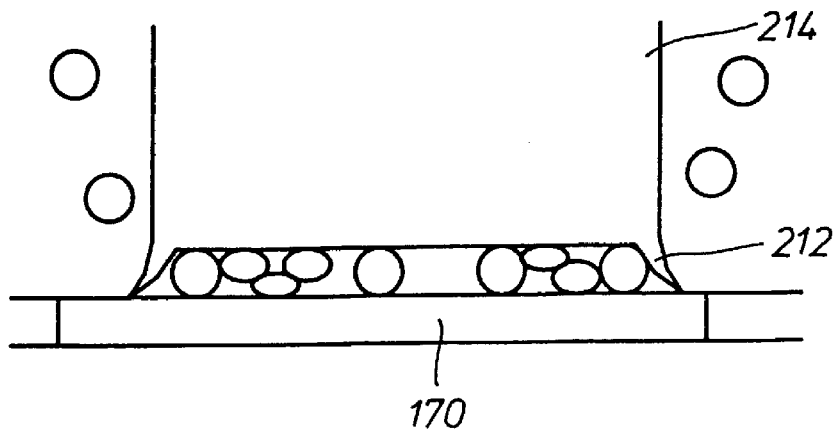

As explained previously, the height of the projection may be less than, greater than, or equal to the average diameter of the conductive balls within the range explained previously. FIGS. 15A–15C show three difference examples of conductive particles trapped under a bump and against a pad, with a projection height that is less than the average diameter of the conductive balls (FIG. 15A), equal to the average diameter (FIG. 15B) and greater than the average diameter (FIG. 15C).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display comprising:
   a pad connected to a thin film transistor (TFT) array formed on a transparent substrate;
   an integrated circuit (IC) for generating a signal to operate the TFT array, the IC including an electrode for transmitting the signal generated from the IC to the pad;
   a bump formed on the electrode, the bump being made of a low resistance metal; and
   bonding means, disposed between the pad and the bump formed on the electrode of the IC, for electrically contacting the electrode of the IC and the pad, the bonding means including a plurality of conductive particles,
   wherein the bump has a collecting end which entraps the conductive particles between the bump and the pad.

2. The display of claim 1, wherein the bump includes a projection on the collecting end having an height that is greater than one-half and less than three times an average diameter of the conductive particle.

3. The display of claim 2, wherein the projection is formed on the outer peripheral edge portion of the collecting end.

4. The display of claim 3, wherein the projection has a width and height that is greater than the average diameter of the conductive particles.

5. The display of claim 4, wherein the projection has a height of 1–5 micrometers, and a width of 1–5 micrometers.

6. The display of claim 5, wherein the low resistance metal is gold.

7. The display of claim 2, wherein the height of the projection is greater than the average diameter of the conductive balls and less than three times the average diameter of the conductive balls.

8. The display of claim 2, wherein the height of the projection is greater one half the average diameter of the conductive balls and less than the average diameter of the conductive balls.

9. The display of claim 2, wherein the height of the projection is equal to the average diameter of the conductive balls.

10. The display of claim 2, wherein the bonding means comprises an anisotropic conductive film.

11. A semiconductor device comprising:
    an electrode;
    a pad;
    a bump formed on the electrode; and
    connecting means for connecting the pad and the bump, the connecting means including a plurality of conductive particles dispersed therein, wherein a portion of the bump which contacts the pad includes a projection for entrapping conductive particles between the bump and the pad.

12. The device of claim 11, wherein the projection is continuously formed on an outer peripheral edge of the bump.

13. The device of claim 12, wherein the projection is formed at a slant angle with respect to an upper surface of the bump.

14. The device of claim 13, wherein a distance between outside of the projection and a projection of an adjacent bump is substantially equal to a distance between the electrode and an adjacent electrode.

15. The device of claim 14, wherein a distance between the projection and a projection of an adjacent bump is less than a distance between the electrode and an adjacent electrode.

16. The device of claim 12, wherein the projection is formed at a slant angle with respect to an upper surface of the bump.

17. The device of claim 11, wherein the connecting means includes an anisotropic conductive film.

18. A semiconductor device comprising:
    an electrode;
    a pad;
    a bump formed on the electrode;
    connecting means for conducting the bump and the pad, the connecting means including a plurality of conductive particles, wherein the number of conductive particles bonded to an outer peripheral surface of the bump is greater than the number of conductive particles bonded to a central surface of the bump facing the pad.

19. The device of claim 18, wherein the connecting means includes an anisotropic conductive film.

20. A bump device comprising:
    an electrode; and
    a bump formed on the electrode, the bump including a projection having a pre-determined height and a pre-determined width, the projection formed on an outer peripheral edge of a surface of the bump opposing the surface of the bump facing the electrode.

21. The device of claim 20, wherein the width of the surface of one end of the bump bonded to the electrode is less than a width of a surface of the opposing end bump for connecting to a pad of an IC.

22. The device of claim 21, wherein the projection has a height of 1–5 micrometer.

23. The device of claim 21, wherein the projection has a width of 1–5 micrometer.

24. The device of claim 20, wherein the projection has a height of 1–5 micrometer.

25. The device of claim 20, wherein the projection has a width of 1–5 micrometer.

* * * * *